US011145670B2

(12) United States Patent
Yoshimizu et al.

(10) Patent No.: US 11,145,670 B2
(45) Date of Patent: Oct. 12, 2021

(54) SEMICONDUCTOR STORAGE DEVICE AND MANUFACTURING METHOD THEREOF

(71) Applicant: TOSHIBA MEMORY CORPORATION, Minato-ku (JP)

(72) Inventors: Yasuhito Yoshimizu, Yokkaichi (JP); Tomohiko Sugita, Yokkaichi (JP)

(73) Assignee: TOSHIBA MEMORY CORPORATION, Minato-ku (JP)

(*) Notice: Subject to any disclaimer, the term of this patent is extended or adjusted under 35 U.S.C. 154(b) by 62 days.

(21) Appl. No.: 16/352,015

(22) Filed: Mar. 13, 2019

(65) Prior Publication Data
US 2020/0066751 A1 Feb. 27, 2020

(30) Foreign Application Priority Data

Aug. 21, 2018 (JP) .............................. JP2018-154947

(51) Int. Cl.
*H01L 27/11582* (2017.01)
*H01L 29/792* (2006.01)
*H01L 29/66* (2006.01)
*G11C 16/04* (2006.01)
*H01L 27/1157* (2017.01)

(52) U.S. Cl.
CPC .... *H01L 27/11582* (2013.01); *G11C 16/0466* (2013.01); *H01L 27/1157* (2013.01); *H01L 29/66833* (2013.01); *H01L 29/7926* (2013.01)

(58) Field of Classification Search
CPC ......... H01L 27/11582; H01L 27/11565; H01L 29/7926; H01L 29/66833; H01L 27/1151; G11C 16/0483; G11C 16/0466
See application file for complete search history.

(56) References Cited

U.S. PATENT DOCUMENTS

| 7,847,334 | B2 | 12/2010 | Katsumata et al. |
| 9,653,475 | B1 | 5/2017 | Yoshimizu et al. |
| 9,929,178 | B1 | 3/2018 | Kaneko |
| 10,074,560 | B2 | 9/2018 | Yoon et al. |
| 10,109,641 | B2 | 10/2018 | Arai |
| 10,115,602 | B2 | 10/2018 | Jung et al. |
| 2011/0291176 | A1* | 12/2011 | Lee ................... H01L 29/66833 257/324 |
| 2012/0052674 | A1 | 3/2012 | Lee et al. |
| 2012/0213006 | A1* | 8/2012 | Isomura ............... H01L 21/764 365/185.17 |
| 2016/0071873 | A1 | 3/2016 | Tsuji et al. |

(Continued)

FOREIGN PATENT DOCUMENTS

| JP | 2009-224465 | 10/2009 |
| JP | 2017-103328 | 6/2017 |
| JP | 2019-46918 A | 3/2019 |

*Primary Examiner* — Shih Tsun A Chou

(74) *Attorney, Agent, or Firm* — Oblon, McClelland, Maier & Neustadt, L.L.P.

(57) ABSTRACT

A semiconductor storage device according to an embodiment comprises a substrate. A stack body having first conductive layers and first insulating layers alternately stacked in a first direction is provided on the substrate. A pillar part extends in the first direction in the stack body and has a memory film. An insulating member extends in the first direction at a position different from that of the pillar part in the stack body. A phosphorus-containing insulator is provided below the stack body and the insulating member.

18 Claims, 16 Drawing Sheets

(56) References Cited

U.S. PATENT DOCUMENTS

| | | | | |
|---|---|---|---|---|
| 2017/0040338 A1* | 2/2017 | Lee | ................... | H01L 27/11582 |
| 2018/0175050 A1* | 6/2018 | Son | ................... | H01L 27/11582 |
| 2019/0362792 A1* | 11/2019 | Oh | ................... | H01L 27/11565 |
| 2019/0363100 A1* | 11/2019 | Lee | ................... | H01L 27/11582 |

* cited by examiner

SEMICONDUCTOR STORAGE DEVICE AND MANUFACTURING METHOD THEREOF

CROSS REFERENCE TO RELATED APPLICATIONS

This application is based upon and claims the benefit of priority from the prior Japanese Patent Application No. 2018-154947, filed on Aug. 21, 2018, the entire contents of which are incorporated herein by reference.

FIELD

The embodiments of the present invention relate to a semiconductor storage device and manufacturing method thereof.

BACKGROUND

In a manufacturing method of a nonvolatile memory such as a NAND flash memory having a three-dimensional memory cell array in which insulating films and conductive films are alternately stacked, a step of staking the insulating films and sacrifice films and replacing the sacrifices films with the conductive films via slits passing through the stacked films is known.

DETAILED DESCRIPTION

Figure 1:
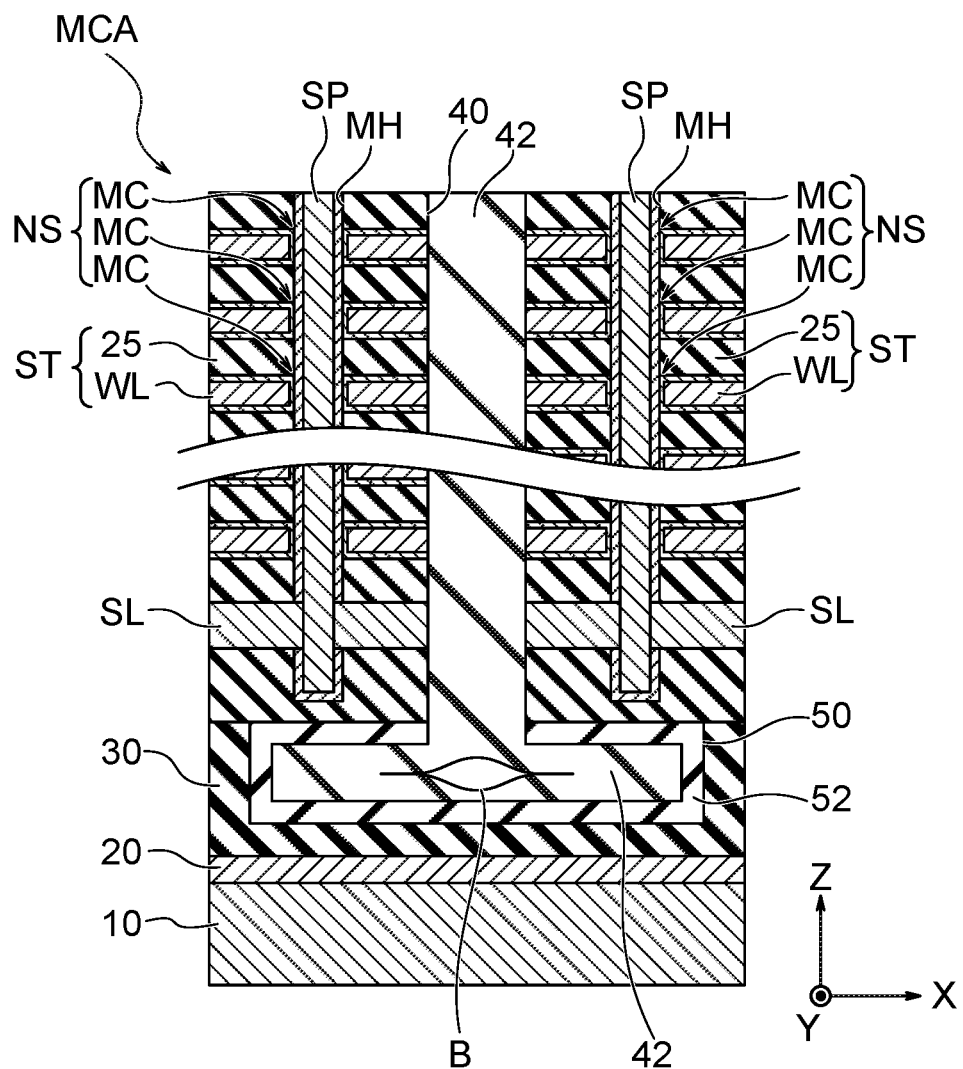
FIG. 1 is a sectional view illustrating an example of a configuration of a semiconductor storage device according to a first embodiment.

Embodiments will now be explained with reference to the accompanying drawings. The present invention is not limited to the embodiments. In the embodiments, "an upper direction" or "a lower direction" refers to a relative direction when a direction perpendicular to a surface of a semiconductor substrate on which semiconductor elements are provided is assumed as "an upper direction". Therefore, the term "upper direction" or "lower direction" occasionally differs from an upper direction or a lower direction based on a gravitational acceleration direction. In the present specification and the drawings, elements identical to those described in the foregoing drawings are denoted by like reference characters and detailed explanations thereof are omitted as appropriate.

A semiconductor storage device according to an embodiment comprises a substrate. A stack body having first conductive layers and first insulating layers alternately stacked in a first direction is provided on the substrate. A pillar part extends in the first direction in the stack body and has a memory film. An insulating member extends in the first direction at a position different from that of the pillar part in the stack body. A phosphorus-containing insulator is provided below the stack body and the insulating member.

First Embodiment

FIG. 1 is a sectional view illustrating an example of a configuration of a semiconductor storage device 1 according to a first embodiment. The semiconductor storage device 1 can be, for example, a semiconductor memory such as a NAND flash memory. A memory cell array MCA of the semiconductor storage device 1 is, for example, a three-dimensional memory cell array in which memory cells are three-dimensionally arranged. In FIG. 1, the memory cell array MCA is illustrated in a simplified manner for easy understanding of the drawing. While silicon is cited as an example of a semiconductor in the following embodiments, semiconductors other than silicon may be used.

An XYZ orthogonal coordinate system is adopted for the convenience of explanations. In this coordinate system, two directions parallel to the surface of a semiconductor substrate 10 and orthogonal to each other are assumed as an X direction and a Y direction, respectively, and a direction orthogonal to the X and Y directions is assumed as a Z direction. Word lines WL serving as conductive layers are stacked in the Z direction.

The semiconductor storage device 1 includes the semiconductor substrate 10, a circuit element 20, an interlayer dielectric film 30, the memory cell array MCA, slits 40, and slits 50.

Although not particularly limited thereto, the semiconductor substrate 10 is, for example, a silicon substrate. A well structure is formed on the surface of the semiconductor substrate 10 as appropriate.

The circuit element 20 is provided on the surface of the semiconductor substrate 10 and is, for example, a CMOS (Complementary Metal Oxide Semiconductor) circuit composed of transistors. The CMOS circuit is, for example, a control circuit that controls the memory cell array MCA. As illustrated in FIG. 1, the circuit element 20 is provided below the memory cell array MCA. The circuit element 20 is simplified and is illustrated as a layer in FIG. 1.

The interlayer dielectric film 30 is provided on the surface of the semiconductor substrate 10 and, for example, covers the circuit element 20. For example, an insulating film such as a silicon dioxide film is used as the interlayer dielectric film 30. While FIG. 1 illustrates the interlayer dielectric film 30 and a stack body ST formed on the circuit element 20, the circuit element 20 can be provided in an area where a stack body is not formed on the semiconductor substrate 10.

The memory cell array MCA is provided on the interlayer dielectric film 30. The memory cell array MCA has the stack body ST in which the word lines WL being first conductive layers and insulating layers 25 being first insulating layers are alternately stacked. Inside the stack body ST, pillar parts SP passing through the stack body ST in a stacking direction (the Z direction) are provided in memory holes MH, respectively. The pillar part SP and the stack body ST constitute a NAND string NS. The NAND string NS has a structure in which memory cells MC each provided between the pillar part SP and the word line WL are connected in series in the Z direction with the pillar part SP. Select gates (not illustrated) are provided at both ends in the Z direction of the NAND string NS, respectively. Detailed configurations of the pillar parts SP and the memory cells MC will be explained later with reference to FIG. 2. The memory cell array MCA is hereinafter referred to also as "stack body ST".

A source line SL is provided between the stack body ST and the interlayer dielectric film 30 with an insulating film interposed therebetween. The source line SL is electrically connected to the pillar parts SP.

The slits 40 are provided in the stack body ST to extend in the Z direction and the inner portions thereof are filled with a silicon dioxide film 42 being a second insulating layer. While the slits 40 extend also in the Y direction, the slits 40 passing through the source line SL are provided partially in the Y direction and do not completely divide the source line SL.

The slits 50 are provided in the interlayer dielectric film 30 provided below the relevant slits 40 and the stack body ST. A compound containing phosphorus (P) and silicon (Si) (hereinafter, "phosphorus-containing insulator" or "phosphorus-containing silica") 52 is provided on inner wall surfaces of the slits 50 and central portions thereof are filled with the silicon dioxide film 42 similarly to the slits 40. There may be a seam or a void B enclosed by the silicon dioxide film 42 in the central portions of the slits 50. The phosphorus-containing insulator 52 extends from the corresponding slit 40 in ±X directions in the interlayer dielectric film 30 and is provided to below the pillar parts SP. The slits 50 are wider in the width in the X direction than the slits 40. The size of the slits 50 in the Y direction can be similar to that of the slits 40 although not particularly limited thereto. The phosphorus-containing insulator 52 is, for example, a silicon oxide (silica) containing phosphorus. The phosphorus-containing insulator 52 adheres also to the inner surfaces of the slits 40 to some extent while illustrations thereof are omitted in FIGS. 1 and 4C. Although FIG. 1 illustrates the phosphorus-containing insulator 52 covering the entire inner walls of the slits 50, the phosphorus-containing insulator 52 may be provided partially.

Figure 2:
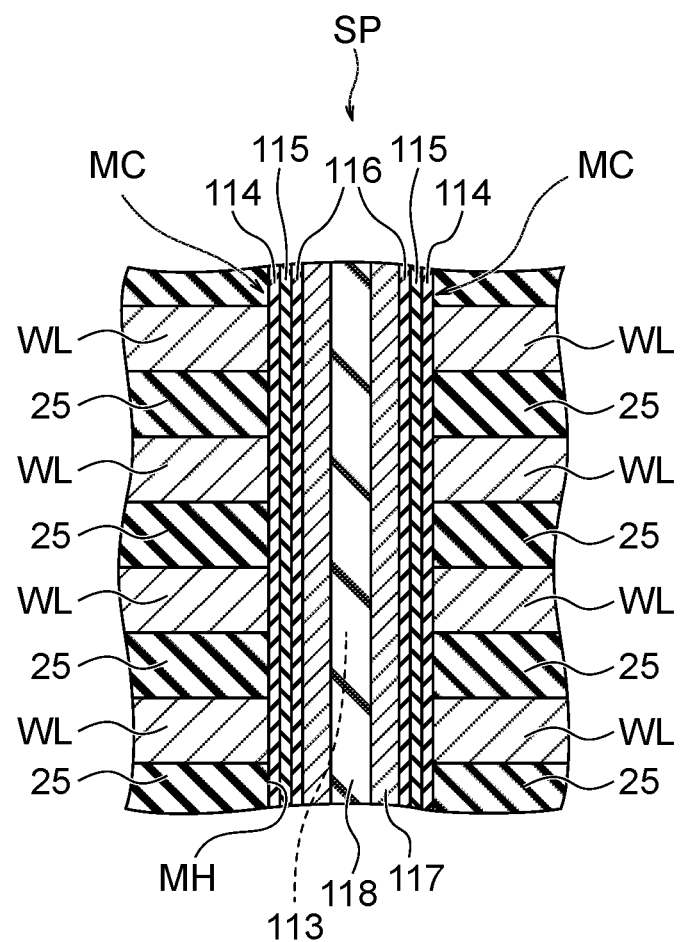
FIG. 2 is a sectional view illustrating a configuration example of the pillar parts and the memory cells.

FIG. 2 is a sectional view illustrating a configuration example of the pillar parts SP and the memory cells MC. An insulator (oxide silicon, for example) 118 is provided in each of the memory holes MH. A block dielectric film 114, a charge accumulating film 15, a tunnel dielectric film 116, and a conductive film (silicon, for example) 117 are provided between the insulator 118 and the word lines WL in this order from the side of the word lines WL. The block dielectric film 114 is in contact with the word lines WL, the tunnel dielectric film 116 is in contact with the conductive film 117, and the charge accumulating film 115 is provided between the block dielectric film 114 and the tunnel dielectric film 116.

The conductive film 117 functions as a channel, the word lines WL function as control gates, and the charge accumulating film 115 functions as a data storage layer that accumulates therein charges injected from the conductive film 117. That is, the memory cells MC each having a structure in which a channel is surrounded by a control gate are formed at intersection parts between the conductive film 117 and the word lines WL, respectively.

The semiconductor storage device 1 according to the present embodiment is a nonvolatile semiconductor storage device that can freely electrically erase and write data and can retain storage contents even if power is turned off. For example, the memory cells MC are memory cells of a charge trapping structure. The charge accumulating film 115 has many traps that trap charges (electrons) and is, for example, a silicon nitride film. The tunnel dielectric film 116 is, for example, a silicon dioxide film and serves as a potential barrier when charges are injected from the conductive film 117 to the charge accumulating film 115 or when charges accumulated in the charge accumulating film 115 are diffused into the conductive film 117. The block dielectric film 114 is, for example, a silicon dioxide film and prevents the charges accumulated in the charge accumulating film 115 from diffusing into the word lines WL.

A manufacturing method of the semiconductor storage device 1 is explained next.

Figure 3:
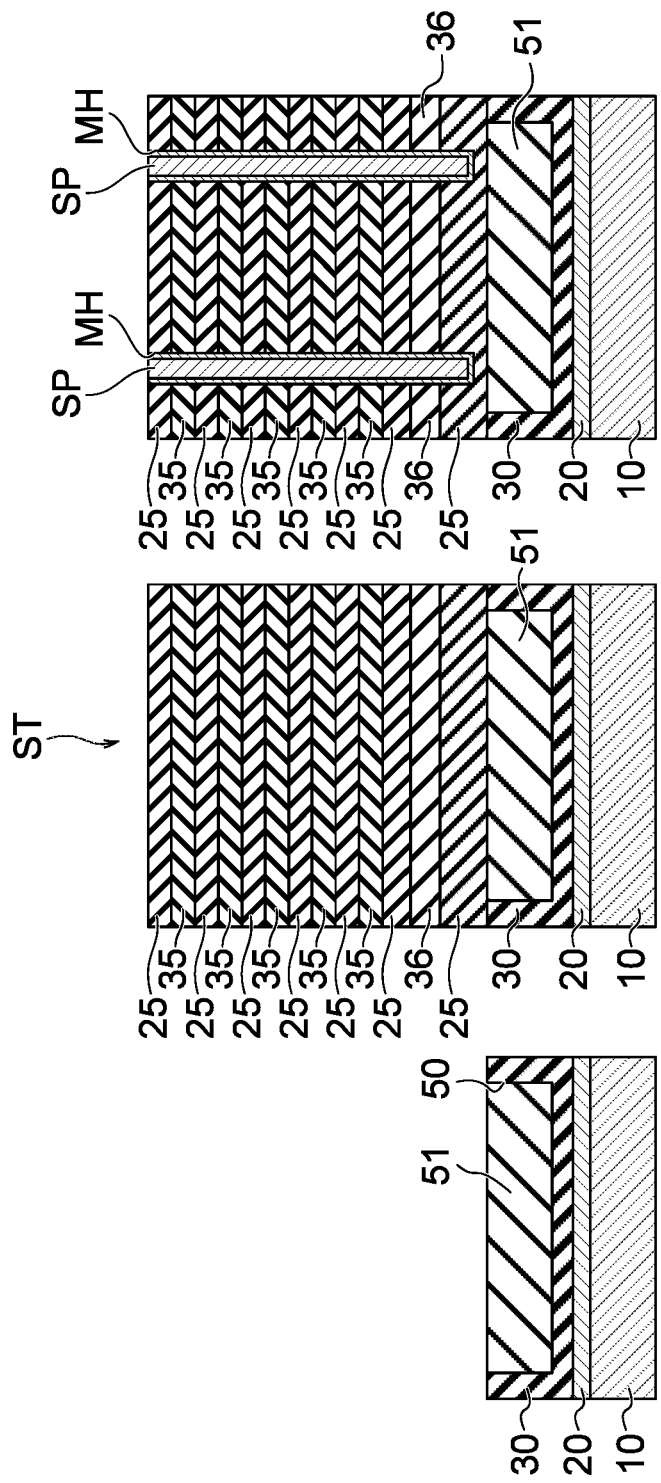
FIGS. 3A-3C to 4A-4C are sectional views illustrating an example of the manufacturing method of the semiconductor storage device according to the first embodiment.

FIGS. 3A-3C to 4A-4C are sectional views illustrating an example of the manufacturing method of the semiconductor storage device 1 according to the first embodiment. First, at a manufacturing step of a semiconductor wafer, the circuit element 20 is formed on the surface of the semiconductor substrate 10 as illustrated in FIG. 3A. Next, the interlayer dielectric film 30 is formed on the circuit element 20.

Subsequently, a top part of the interlayer dielectric film 30 in partial areas is removed using a lithography technique and an etching technique to form the slits 50. In the present embodiment, the slits 50 are, for example, box spaces (hollow spaces) and are formed in a planar pattern wider than that of the slits 40 in the X direction. Next, a sacrifice layer 51 is embedded in the slits 50. The sacrifice layer 51 is a material etchable with respect to the interlayer dielectric film 30 and the stack body ST formed later and can be, for example, non-doped polysilicon, amorphous silicon, or metal. Next, the sacrifice layer 51 is flattened using a CMP (Chemical Mechanical Polishing) method. Accordingly, the sacrifice layer 51 is embedded in the slits 50 as illustrated in FIG. 3A.

Next, the insulating layers 25 and sacrifice layers 35 and 36 are alternately stacked on the interlayer dielectric film 30 and the sacrifice layer 51 as illustrated in FIG. 3B. The stack body ST at this stage is a stack body including the insulating layers 25 and the sacrifice layers 35 and 36. The lowermost sacrifice layer 36 will be replaced later to form an electrode of the source line SL. The insulating layers 25 are, for example, silicon dioxide films. The sacrifice layers 35 are a material selectively etchable with respect to the insulating layers 25 and are, for example, silicon nitride films. The sacrifice layer 36 is a material selectively etchable with respect to the insulating layers 25 and the sacrifice layers 35 and are, for example, silicon or polysilicon.

Next, the memory holes MH extending in the stacking direction of the stack body ST are formed in the stack body ST using a lithography technique and an etching technique as illustrated in FIG. 3C. At that time, because the stack body ST is a stacked film including the insulating layers (silicon dioxide films, for example) 25 and the sacrifice layers (silicon nitride films) 35, the stack body ST is more easily processed than the metal material (tungsten, for example) of the word lines WL.

Subsequently, the block dielectric film 114, the charge accumulating film 115, and the tunnel dielectric film 116 illustrated in FIG. 2 are formed in the memory holes MH. The conductive film (silicon, for example) 117 is further formed in the memory holes MH. Further, the memory holes MH are filled with the insulator 118. Accordingly, the pillar parts SP are formed to extend in the memory holes MH in the Z direction as illustrated in FIG. 3C.

Figure 4:
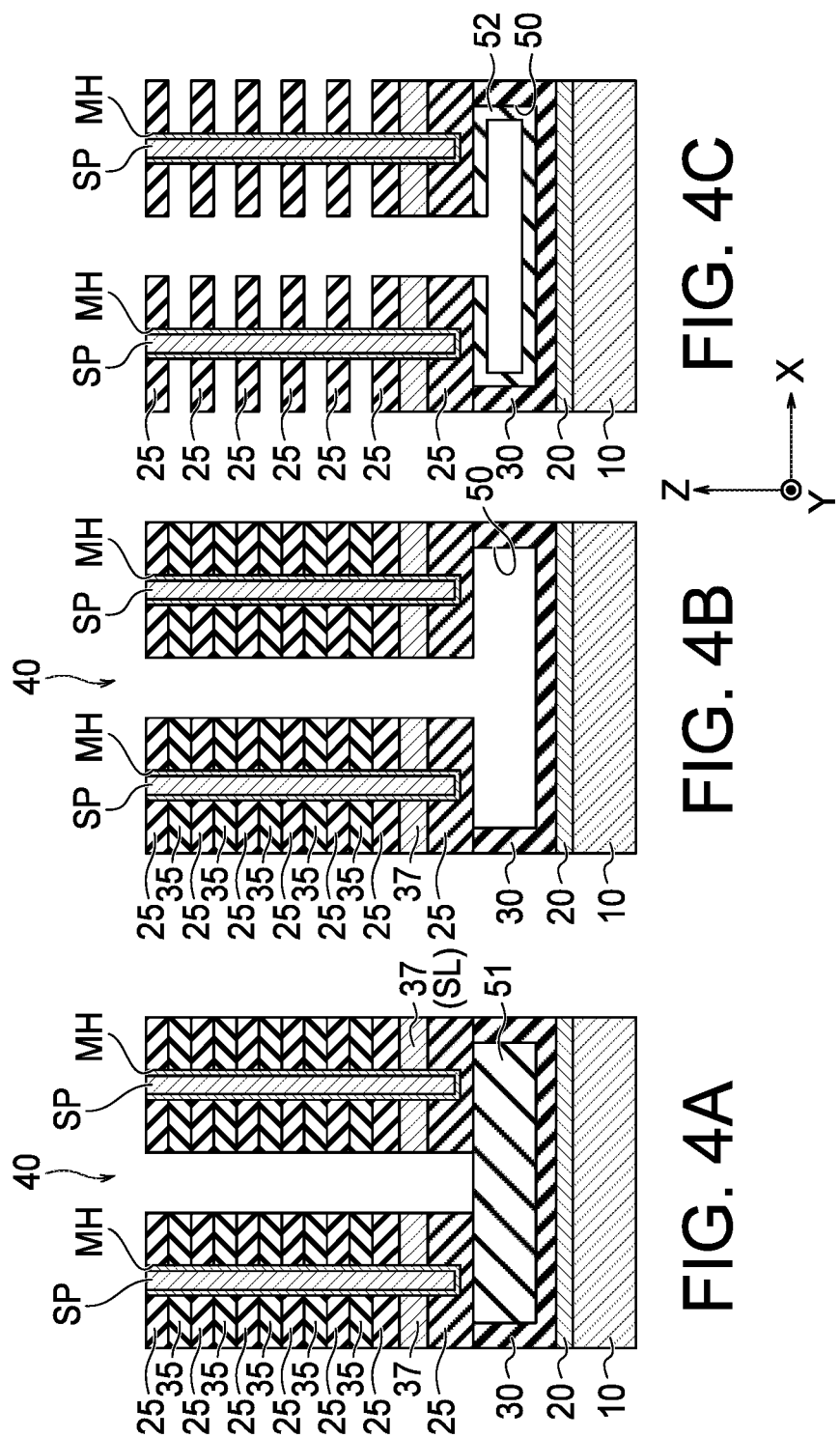

Next, the slits 40 are formed to extend in the Z direction in the stack body ST using a lithography technique and an etching technique as illustrated in FIG. 4A. The slits 40 are formed on the sacrifice layer 51 separately from the memory holes MH and pass through the stack body ST to reach the sacrifice layer 51.

Subsequently, the sacrifice layer 36 is removed via the slits 40 and the block dielectric film 114 and the charge accumulating film 115 adjacent to the sacrifice layer 36 and provided between the sacrifice layer 36 and the conductive film 117 are also removed. The tunnel dielectric film 116 provided between the sacrifice layer 36 and the conductive film 117 is left behind. At that time, the sacrifice layer 36 is selectively removed and the sacrifice layers 35 are not removed.

Next, a material 37 of the source line SL is embedded in a space where the sacrifice layer 36 has been present. Possible examples of the material 37 are doped polysilicon containing boron or the like and metal such as tungsten although not limited thereto. Accordingly, the source line SL is formed.

Next, the sacrifice layer 51 is removed via the slits 40 using an etching technique to form the slits 50 being hollow parts as illustrated in FIG. 4B. The sacrifice layer 51 is formed in the interlayer dielectric film 30 at a deeper position than the stack body ST to be wider in the X direction and/or the Y direction than the slits 40. Accordingly, the slits 50 are also formed at an identical position and of an identical size to those of the sacrifice layer 51. That is, the slits 50 are formed below the relevant slits 40 and the stack body ST to extend in the X direction and/or the Y direction substantially orthogonal to the Z direction and to be wider in the X direction and/or the Y direction than the slits 40. The material of the sacrifice layer 51 described above also depends on the etching selectivity to the material 37. For example, when the material 37 is boron-doped polysilicon, non-doped polysilicon is possibly used as the sacrifice layer 51. In this case, the sacrifice layer 51 can be selectively etched using an alkaline solution.

Subsequently, an etchant is supplied into the slits 40 and the slits 50 to remove the sacrifice layers 35 as illustrated in FIG. 4C. The sacrifice layers 35 are, for example, silicon nitride films and a possible etchant is, for example, a hot phosphoric acid solution or a nitric acid solution. A case where a hot phosphoric acid solution is used is explained below as an example. Wet etching with a hot phosphoric acid solution does not require use of an expensive vacuum device and enables simultaneous treatment of a plurality of semiconductor substrates. Therefore, the wet etching with a hot phosphoric acid solution is low in the etching cost and is frequently used.

In the present embodiment, because there is no silicon nitride film in the slits 50, a compound (hereinafter, silica) containing silicon (Si) eluted from the silicon nitride films of the sacrifice layers 35 due to the treatment with the hot phosphoric acid solution diffuses into the slits 50 and increases the silica concentration in the slits 50. Due to accumulation of the hot phosphoric acid solution in the slits 50 at a high silica concentration, the phosphorus-containing silica (phosphorus-containing insulator) 52 contained in the hot phosphoric acid solution deposits also on the inner walls of the slits 50 as illustrated in FIG. 4C. As illustrated in FIG. 1, the phosphorus-containing silica 52 deposits also on the bottom surfaces of the slits 50. That is, the phosphorus-containing silica 52 deposits in a layer manner or a line manner in a direction substantially perpendicular to the Z direction (in a substantially horizontal direction) with a certain height in the Z direction in the interlayer dielectric film 30.

According to the present embodiment, a large amount of the phosphorus-containing silica 52 deposits on the inner surfaces of the slits 50 and the amount of the phosphorus-containing silica depositing on the insulating layers 25 can be reduced correspondingly. Therefore, the distance between the insulating layers 25 adjacent in the Z direction is not narrowed so much and the material (tungsten, for example) of the word lines WL can be easily embedded at a step subsequent to FIG. 4C. As described above, illustrations of the phosphorus-containing silica 52 depositing on the insulating layers 25 are omitted in FIGS. 1 and 4C.

Next, the material of the word lines WL being the first conductive layers is embedded in positions where the sacrifice layers 35 have been present. For example, a conductive material such as tungsten or titanium nitride (TiN) is used as the material of the word lines WL. The word lines WL may be stacked layers of a plurality of metal materials. For example, it is possible that titanium nitride is thinly formed as a barrier metal at the positions where the sacrifice layers 35 have been present and that tungsten is thereafter embedded. In this way, the conductive material of the word lines WL is formed in the slits 40 and the slits 50.

The conductive material (first metal) formed on the side surfaces of the insulating layers 25 in the slits 40 is removed using an etching technique to prevent short-circuiting between the word lines WL adjacent in the Z direction. Although the conductive material in the slits 50 is removed at the same time as removal of the conductive material formed on the side surfaces of the insulating layers 25, the conductive material sometimes remains on the inner walls of the slits 50. However, even if the conductive material remains in the slits 50, the function of the semiconductor storage device 1 is not negatively affected thereby. When the conductive material remains on the inner walls of the slits 50, the conductive material possibly deposits in a layer manner on the inner walls of the slits 50 similarly to the phosphorus-containing silica 52 illustrated in FIG. 1. The conductive material (second metal) in the slits 50 is provided below the stack body ST and the insulating layer 42 and is in contact with the insulating layer 42. The conductive material (second metal) in the slits 50 is made of the same material of the first metal.

Next, the insulating layer 42 is embedded in the slits 40 and the slits 50. For example, an insulating film such as a silicon dioxide film is used as the insulating layer 42. Accordingly, the structure illustrated in FIG. 1 is obtained.

Thereafter, a multi-layer wiring layer (not illustrated) including bit lines is formed on the stack body ST. Accordingly, the semiconductor storage device 1 illustrated in FIG. 1 is completed.

As described above, according to the present embodiment, the slits 50 are formed under the corresponding slits 40. The slits 50 can accumulate an etchant (a hot phosphoric acid solution) therein and cause the phosphorus-containing silica 52 to deposit also on the inner walls of the slits 50. Accordingly, the amount of the phosphorus-containing silica 52 depositing on the insulating layers 25 in the slits 40 can be reduced. As a result, the material (tungsten, for example) of the word lines WL can be easily embedded in between the insulating layers 25 adjacent in the Z direction and defects of the word lines WL can be suppressed. With provision of the slits 50, the number of the stacked layers in the stack body ST, that is, the number of the stacked word lines WL can be increased and the density of the storage capacity can be improved.

Furthermore, the deposition speed of the phosphorus-containing silica 52 can be changed by the material or the surface treating method. For example, it is possible that the inner surfaces of the slits 40 on which the phosphorus-containing silica 52 is not to be deposited are ended with a carbon material and that the inner surfaces of the slits 50 on which the phosphorus-containing silica 52 is to be deposited are ended with a silicon oxide or a silicon hydroxide. Accordingly, the inner surfaces of the slits 50 may be surface-treated to be ended with a silicon oxide or a silicon hydroxide.

Second Embodiment

Figure 5:
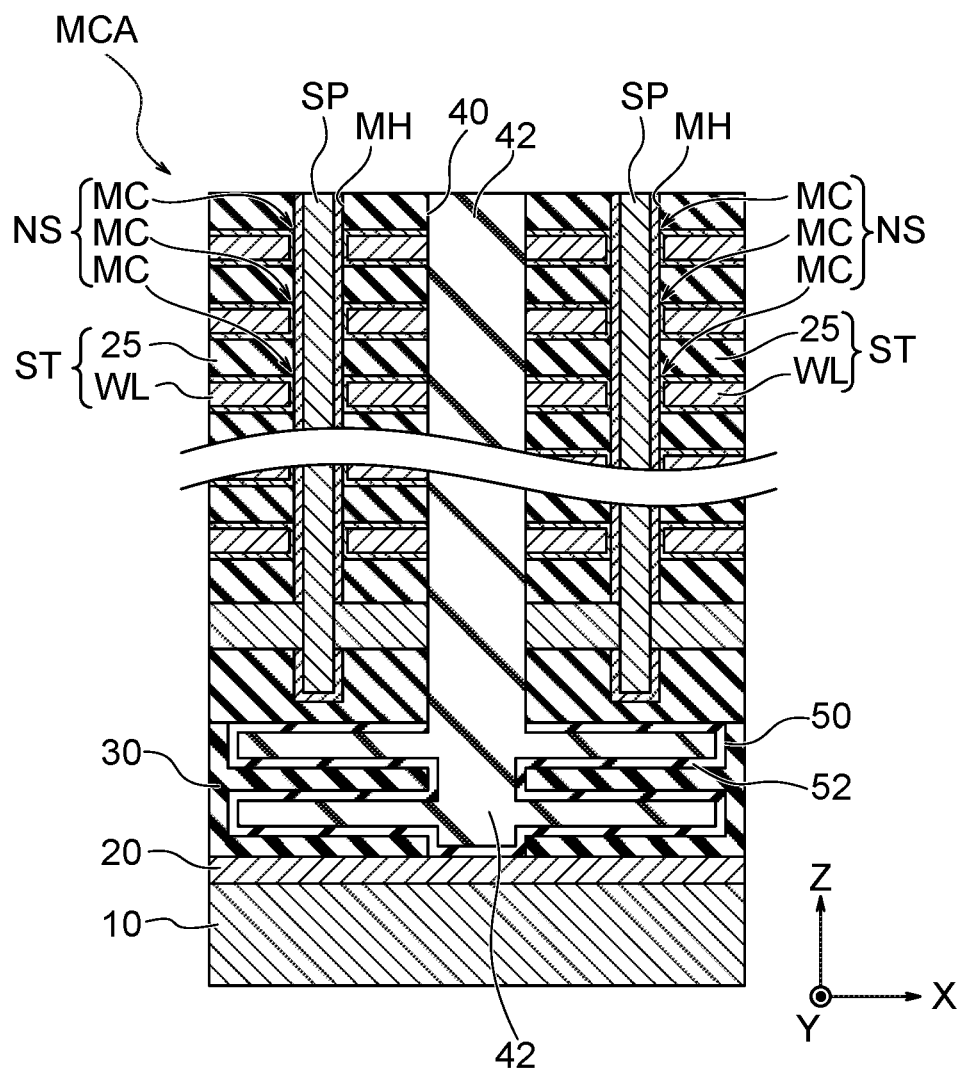
FIG. 5 is a sectional view illustrating an example of a configuration of a semiconductor storage device according to a second embodiment.

FIG. 5 is a sectional view illustrating an example of a configuration of a semiconductor storage device 2 according to a second embodiment. The second embodiment is different from the first embodiment in the shape of the slits 50. The side surfaces of the slits 50 according to the second embodiment are formed in an indented shape or in a zigzag shape. This increases the area of the inner surfaces of the slits 50. The phosphorus-containing silica 52 depositing in the slits 50 deposits along the inner surfaces of the slits 50. Therefore, the second embodiment can increase the amount of silica depositing on the inner surfaces of the slits 50 and inversely further decrease the amount of phosphorus-containing silica depositing on the insulating layers 25.

The shape of the slits 50 is not particularly limited. However, it is preferable that the area of the inner surfaces of the slits 50 is larger to decrease the amount of phosphorus-containing silica depositing on the insulating layers 25.

Other configurations in the second embodiment can be identical to corresponding configurations in the first embodiment. Therefore, the second embodiment can achieve identical effects as those in the first embodiment.

The shape of the slits 50 according to the second embodiment is obtained by repeating formation of the interlayer dielectric film 30 and embedment of the sacrifice layer 51 plural times while changing the width of the slits 50 in the X direction at the step illustrated in FIG. 3A. The step illustrated in FIG. 3B and subsequent steps can be identical to those in the first embodiment. The slits 50 according to the second embodiment can be formed in this manner.

Third Embodiment

Figure 6:
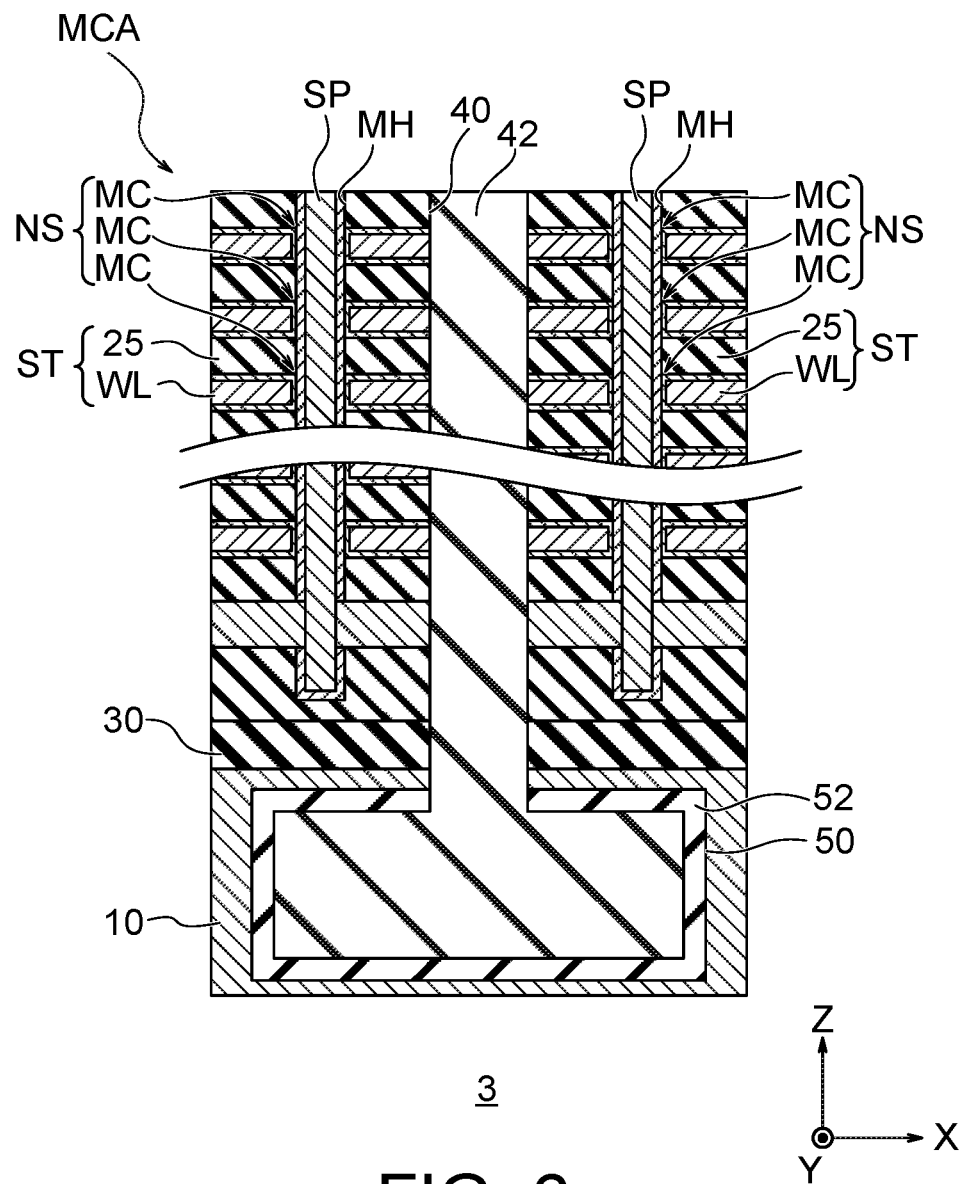
FIG. 6 is a sectional view illustrating an example of a configuration of a semiconductor storage device according to a third embodiment.

FIG. 6 is a sectional view illustrating an example of a configuration of a semiconductor storage device 3 according to a third embodiment. The third embodiment is different from the first embodiment in that the slits 50 are provided in the semiconductor substrate 10. Therefore, the phosphorus-containing silica 52 is formed along the inner surfaces of the slits 50 in the semiconductor substrate 10. The circuit element 20 is formed in an area different from the area where the stack body is formed on the semiconductor substrate 10. Other configurations in the third embodiment can be identical to corresponding configurations of the first embodiment. Therefore, even when the slits 50 are provided in the semiconductor substrate 10, effects of the third embodiment are not lost.

In the third embodiment, the semiconductor substrate 10 is processed using a lithography technique and an etching technique to embed the sacrifice layer 51 before the step illustrated in FIG. 3A. The slits 40 in FIG. 4A are formed to reach the corresponding slits 50 in the semiconductor substrate 10. Other steps in the third embodiment can be identical to corresponding steps in the first embodiment. The slits 50 according to the third embodiment can be thereby formed.

The third embodiment can be combined with the second embodiment. That is, the shape of the slits 50 is not particularly limited. It is preferable that the area of the inner surfaces of the slits 50 is large to decrease the amount of phosphorus-containing silica depositing on the insulating layers 25.

Fourth Embodiment

Figure 7:
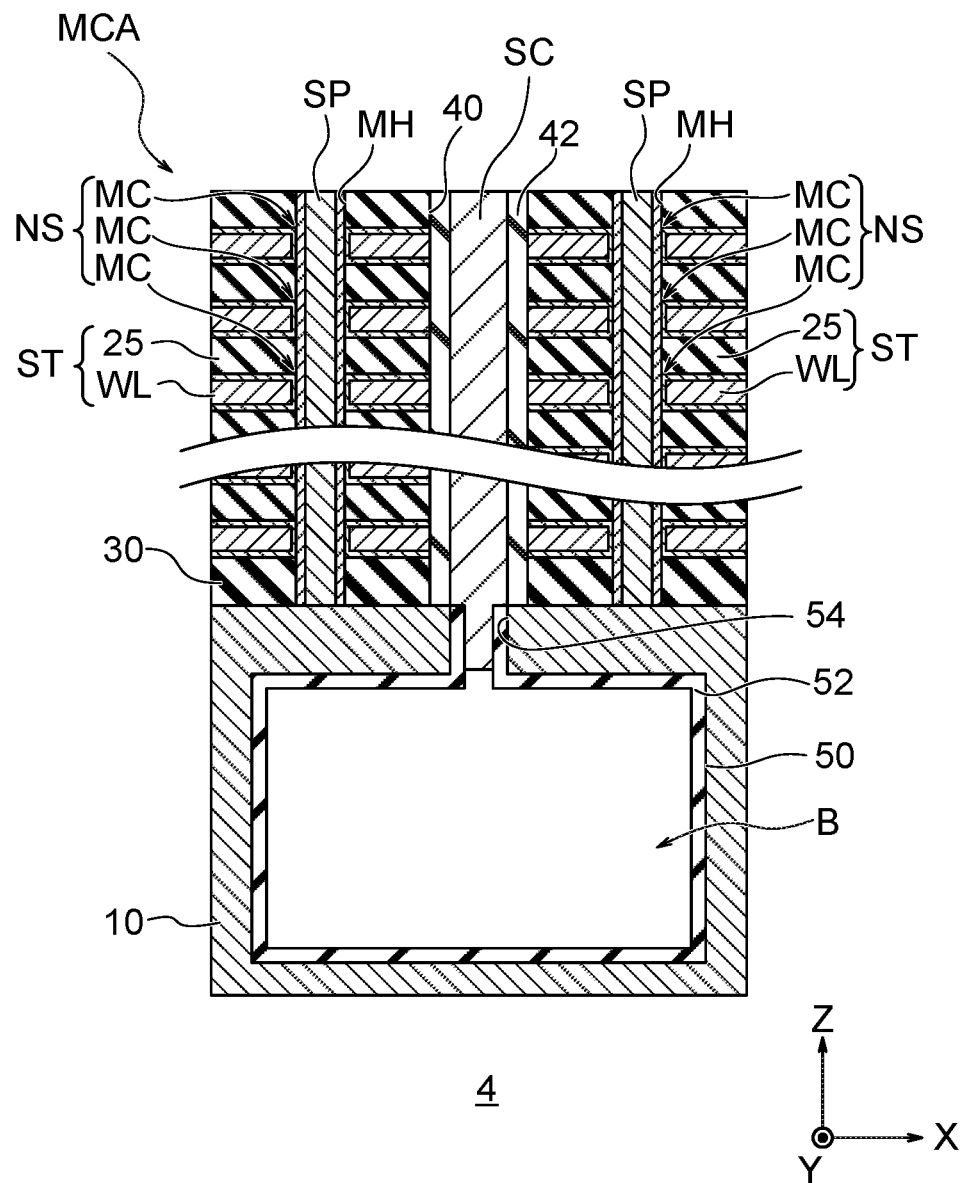
FIG. 7 is a sectional view illustrating an example of a configuration of a semiconductor storage device according to a fourth embodiment.

FIG. 7 is a sectional view illustrating an example of a configuration of a semiconductor storage device 4 according to a fourth embodiment. The fourth embodiment is identical to the third embodiment in that the slits 50 are provided in the semiconductor substrate 10. However, the fourth embodiment is different from the third embodiment in that a source-line contact plug SC is provided not between the stack body and the semiconductor substrate 10 but in the slits 40.

Because the opening width of an inlet 54 between each of the slits 40 and the corresponding slit 50 is formed to be narrower than the opening width of the slit 40, the material of the source-line contact plug SC closes the inlet 54. Therefore, while the phosphorus-containing silica 52 is formed along the inner surfaces of the slits 50 in the semiconductor substrate 10, the inner portions of the slits 50 are hollow spaces or voids B.

For example, conductive metal such as tungsten is used as the source-line contact plug SC. No problem occurs even if the material of the source-line contact plug SC enters the inner portions of the slits 50. However, considering the material cost, short-circuiting between the source-line contact plug SC and the pillar parts SP, and the like, it is preferable that the material of the source-line contact plug SC does not enter the inner portions of the slits 50. According to the present embodiment, with the narrow opening width of the inlets 54 of the slits 50, the material of the source-line contact plug SC naturally closes the inlets 54 during formation of the source-line contact plug SC.

As described above, the slits 50 can be applied also to the embodiment in which the source-line contact plug SC is provided in the inner portions of the slits 40. Therefore, the fourth embodiment can achieve identical effects to those in the first embodiment.

In the fourth embodiment, the semiconductor substrate 10 is processed using a lithography technique and an etching technique to embed the sacrifice layer 51 before the step illustrated in FIG. 3A. The slits 40 in FIG. 4A are formed to reach the corresponding slits 50 in the semiconductor substrate 10. However, the slits 40 are formed to be narrow and narrow inlets 54 are formed on the semiconductor substrate 10 in first processing using the lithography technique and the etching technique, and the width of the slits 40 is enlarged while the width of the inlets 54 is maintained in second processing using the lithography technique and the etching technique. In this way, the inlets 54 of the slits 50 can be formed to be narrow.

Next, the steps explained with reference to FIGS. 4B and 4C are performed. The phosphorus-containing silica 52 deposits on the inner walls of the slits 50.

Thereafter, the material of the word lines WL is embedded in between the insulating layers 25, then the silicon dioxide film 42 is deposited on the inner surfaces of the slits 40, and the material (tungsten, for example) of the source-line contact plug SC is embedded in the slits 40. At that time, because the inlets 54 of the slits 50 are narrower than the slits 40, the inlets 54 are closed by the material of the source-line contact plug SC, and hollow spaces remain in the inner portions of the slits 50, respectively.

The fourth embodiment can be combined with the second embodiment. That is, the shape of the slits 50 is not particularly limited. It is preferable that the area of the inner surfaces of the slits 50 is large to decrease the amount of phosphorus-containing silica depositing on the insulating layers 25.

Fifth Embodiment

Figure 8:
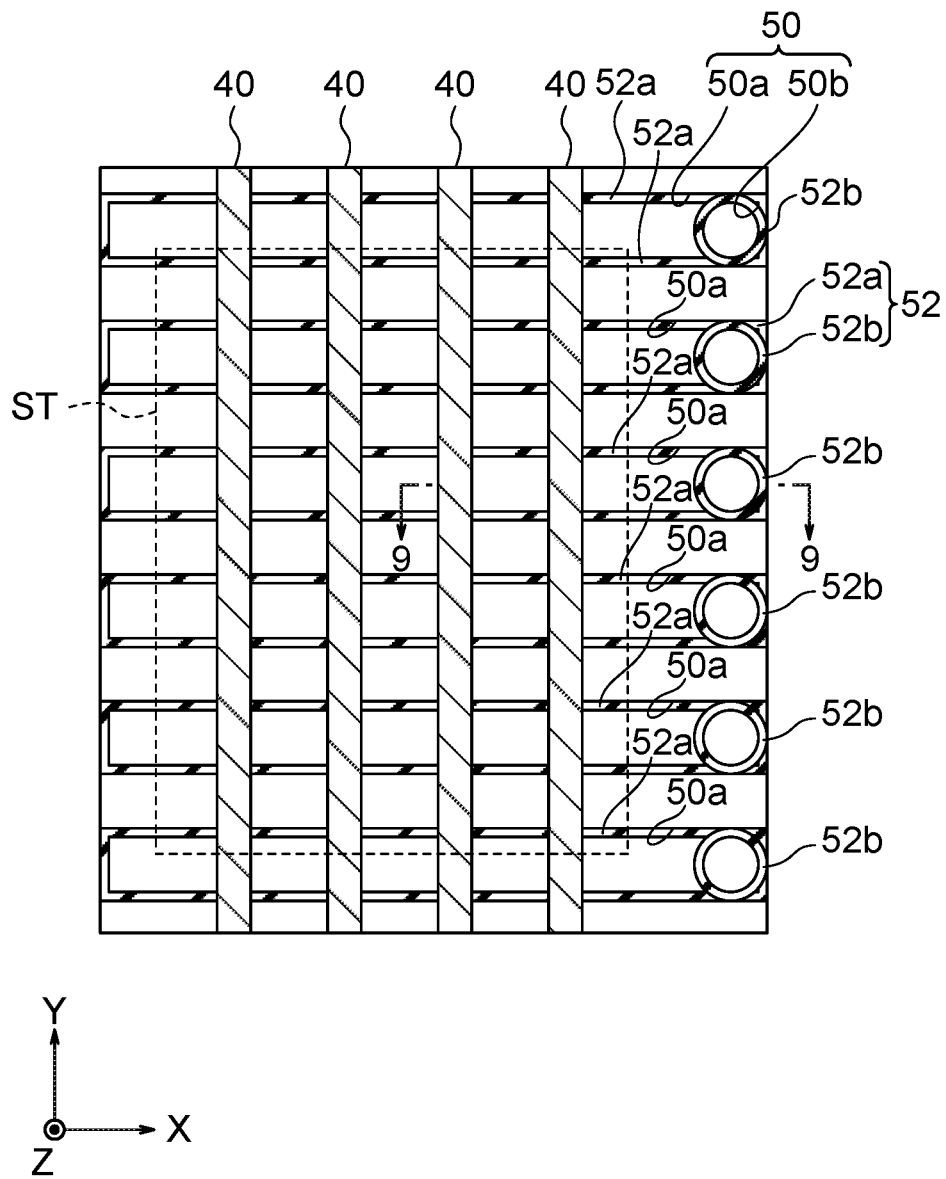
FIG. 8 is a plan view illustrating an example of a configuration of a semiconductor storage device according to a fifth embodiment.

FIG. 8 is a plan view illustrating an example of a configuration of a semiconductor storage device 5 according to a fifth embodiment. Illustrations of the stack body ST, upper wires, and the like are omitted in FIG. 8. The outer shape of the stack body ST is indicated by a broken line.

In the first to fourth embodiments, the slits 50 are provided as hollow spaces closed like a box. In contrast thereto, in the fifth embodiment, each of the slits 50 includes a path 50a extending in the X direction and a hole 50b extending in the Z direction. The path 50a being a first hollow area is provided below the stack body ST and extends in a direction (the X direction) substantially orthogonal to the slits 40 in a planar view from above in the Z direction. A plurality of the paths 50a extend to be parallel in the Y direction (in a stripe manner) in the planar view. The paths 50a are communicated with the slits 40 and the holes 50b. The holes 50b being second hollow areas are formed in an area where the circuit element 20 is not provided on the outside of the stack body ST. The holes 50b extend in the Z direction (the stacking direction) on the outside of the stack body ST. The holes 50b are not limited to a hole shape and can be a concave shape communicating with the corresponding paths 50a.

Phosphorus-containing silica 52a being a first insulator area is provided on the inner walls of the paths 50a and phosphorus-containing silica 52b being a second insulator area is provided on the inner walls of the holes 50b. The phosphorus-containing silica 52a extends in the X direction along the paths 50a below the stack body ST. The phosphorus-containing silica 52b extends in the Z direction along the holes 50b on the outside of the stack body ST. In FIG. 8, the phosphorus-containing silica 52a and the phosphorus-containing silica 52b partially overlap with each other on the outside of the stack body ST. This indicates that the path 50a and the hole 50b are connected to each other.

Figure 9:
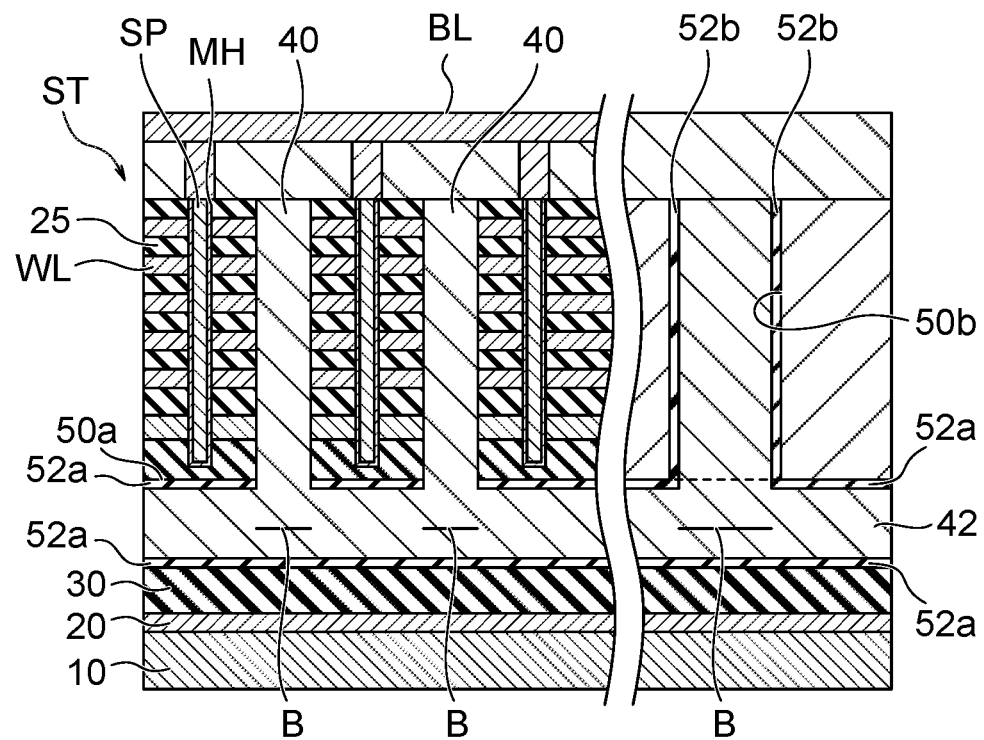
FIG. 9 is a sectional view along a line 9-9 in FIG. 8.

FIG. 9 is a sectional view along a line 9-9 in FIG. 8. The configuration of the stack body ST can be identical to that of the stack body ST in the first to fourth embodiments. Configurations of the bit lines BL and the contact plugs are also illustrated in FIG. 9. The bit lines BL extend in the X direction and are electrically connected in common to a plurality of the pillar parts SP arrayed in the X direction. Wires for the word lines extend in the Y direction and are electrically connected independently to the word lines WL formed in a stepwise manner (not illustrated).

The paths 50a extend in the X direction below the stack body ST and are connected to the corresponding holes 50b on the outside of the stack body ST. The holes 50b extend in the Z direction from the corresponding paths 50a to the height of the top surface of the stack body ST on the outside of the stack body ST.

As described above, the phosphorus-containing silica 52a is provided on the inner walls of the paths 50a and the phosphorus-containing silica 52b is provided on the inner walls of the holes 50b. The phosphorus-containing silica 52a extends in the X direction along the paths 50a below the stack body ST. The phosphorus-containing silica 52b extends in the Z direction along the holes 50b on the outside of the stack body ST. Illustrations of phosphorus-containing silica depositing on the inner walls of the slits 40 are omitted in FIG. 9. A seam or a void B enclosed by the silicon dioxide film 42 may be provided on central portions of the paths 50a.

Figure 10:
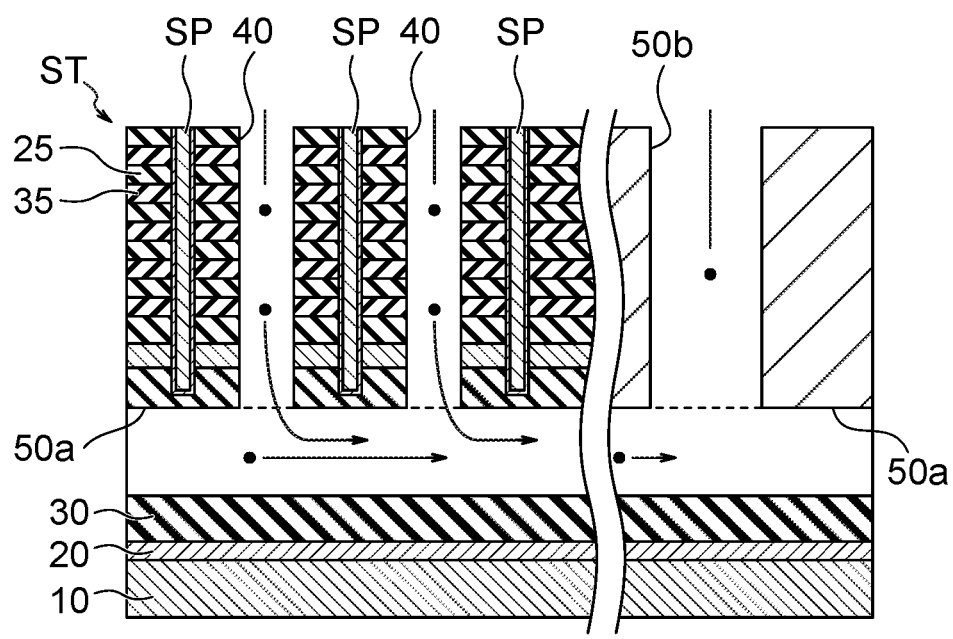
FIG. 10 is a sectional view illustrating a state of an etching step of the sacrifice layers in the fifth embodiment.

FIG. 10 is a sectional view illustrating a state of an etching step of the sacrifice layers 35 in the fifth embodiment. The paths 50a can be obtained by forming the sacrifice layer 51 illustrated in FIG. 3A in a pattern of lines as illustrated in FIG. 8. The holes 50b can be formed simultaneously with the slits 40 at the formation step of the slits 40. After the slits 40 and the holes 50b are formed, the sacrifice layers 51 for the paths 50a are removed via the slits 40 and the holes 50b. Accordingly, the paths 50a and the holes 50b illustrated in FIGS. 8 and 9 can be formed using an identical manufacturing method to that in the first embodiment.

As illustrated in FIG. 10, the slits 40, the paths 50a, and the holes 50b are communicated with each other. Therefore, during wet etching of the sacrifice layers 35 with a hot phosphoric acid solution, the hot phosphoric acid solution can flow through the slits 40, the paths 50a, and the holes 50b as indicated by arrows in FIG. 10. That is, the hot phosphoric acid solution can be discharged through the paths 50a and the holes 50b. Conversely, the hot phosphoric acid solution can flow into from the paths 50a and the holes 50b and be discharged from the top parts of the slits 40. This enables the phosphorus-containing silica 52a and the phosphorus-containing silica 52b to deposit on the paths 50a and the holes 50b, respectively, as illustrated in FIG. 9. Furthermore, the hot phosphoric acid solution containing silica can be discharged from the holes 50b or the slits 40. Therefore, the fifth embodiment can increase the discharge efficiency of the phosphorus-containing silica 52 and can further decrease the amount of the phosphorus-containing silica 52 depositing on the insulating layers 25 on the bottom parts of the slits 40. Because the flow of the hot phosphoric acid solution is improved, the difference in the deposition amount of phosphorus-containing silica between the top parts and the bottom parts of the slits 40 is further reduced. The hot phosphoric acid solution flows through the paths 50a and the holes 50b and accordingly the volume of the slits 50 (the paths 50a and the holes 50b) themselves can be small.

As illustrated in FIG. 8, the paths 50a extend in a direction substantially orthogonal to the slits 40. Therefore, the paths 50a can substantially uniformly and efficiently flow the hot phosphoric acid solution from the slits 40 or to the slits 40. Accordingly, variation in the deposition amount of phosphorus-containing silica can be suppressed by the slits 40.

Other steps in the fifth embodiment can be identical to those in the first embodiment. Therefore, after the sacrifice layers 35 are removed with the hot phosphoric acid solution and the word lines WL are formed, the slits 40, the paths 50*a*, and the holes 50*b* are filled with an insulating film such as a silicon dioxide film. Thereafter, the contact plugs, the bit lines BL, and the like are formed, whereby the semiconductor storage device 5 illustrated in FIG. 9 is completed.

Sixth Embodiment

Figure 11:
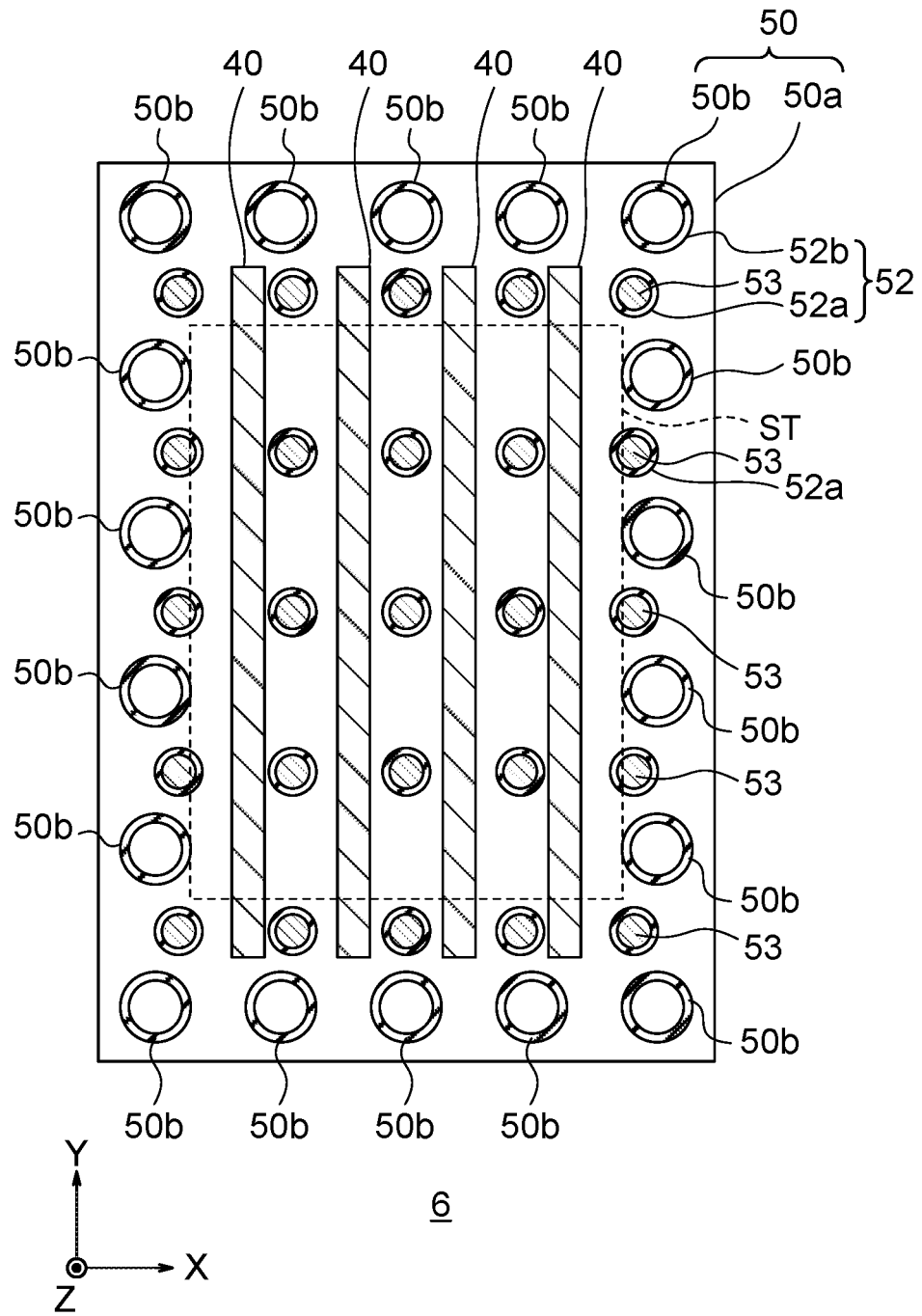
FIG. 11 is a plan view illustrating a configuration example of a semiconductor storage device according to a sixth embodiment.

FIG. 11 is a plan view illustrating a configuration example of a semiconductor storage device 6 according to a sixth embodiment. The path 50*a* in the semiconductor storage device 6 is not a rectangular shape extending in the X direction and separated in the Y direction as illustrated in FIG. 5 and is provided entirely (on the whole surface) below the stack body ST. In a planar view in the Z direction from above as illustrated in FIG. 11, the path 50*a* is formed in a square shape although not particularly limited thereto. Because the path 50*a* is provided entirely below the stack body ST, pillar parts 53 are provided between the stack body ST and the interlayer dielectric film 30 in the path 50*a* to prevent the stack body ST on the path 50*a* from falling. The pillar parts 53 support the stack body ST to prevent the stack body ST from falling and closing the path 50*a*. In the planar view from above in the Z direction as illustrated in FIG. 11, it is preferable that the pillar parts 53 are arranged substantially equally in the path 50*a*.

Meanwhile, the holes 50*b* are arranged substantially equally to surround the stack body ST. Substantially equal arrangement of the holes 50*b* with respect to the stack body ST enables the holes 50*b* to substantially equally discharge the hot phosphoric acid solution from the path 50*a*. Because the path 50*a* is provided entirely below the stack body ST, the flexibility in the arrangement of the holes 50*b* is enhanced.

The phosphorus-containing silica 52 deposits on the inner walls of the path 50*a* and the holes 50*b* with which the hot phosphoric acid solution comes into contact. Therefore, the phosphorus-containing silica 52 is provided entirely below the stack body ST and is formed in a layer manner. As illustrated in FIG. 11, the phosphorus-containing silica 52*a* deposits also on the side walls of the pillar parts 53. Therefore, the phosphorus-containing silica 52*a* is left behind also in the manner of pillars below the stack body ST.

Figure 12:
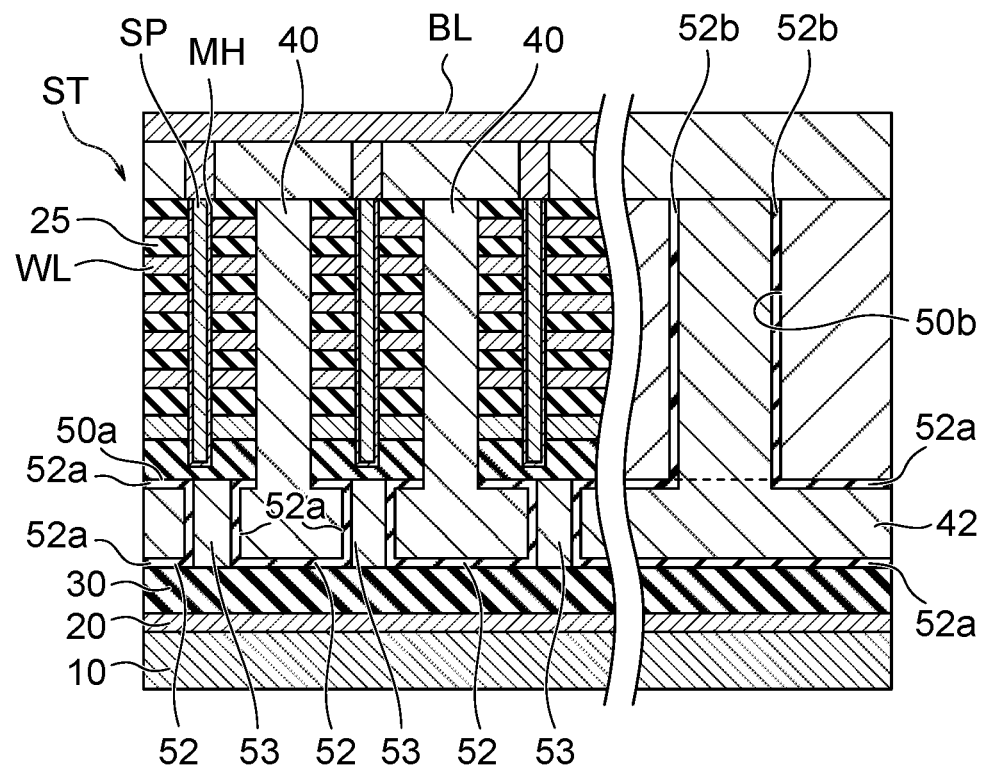
FIG. 12 is an XZ sectional view at a certain position in the semiconductor storage device.

FIG. 12 is an XZ sectional view at a certain position in the semiconductor storage device 6. Note that FIG. 12 is an example of the sectional view and illustrates a case where the pillar parts 53 and the holes 50*b* are arranged in same straight lines (in X lines, for example), respectively. The configuration of the stack body ST can be identical to that of the stack body ST in the fifth embodiment.

The path 50*a* extends in an XY plane below the stack body ST and is connected to the holes 50*b* on the outside of the stack body ST. The holes 50*b* extend in the Z direction from the path 50*a* to the height of the top surface of the stack body ST on the outside of the stack body ST. Because the holes 50*b* are provided on the outside of the stack body ST, the sacrifice layers 35 of the stack body ST are not exposed in the holes 50*b*. Therefore, the sacrifice layers 35 are removed via the slits 40 without being etched via the holes 50*b*.

As described above, the phosphorus-containing silica 52*a* is provided on the inner wall of the path 50*a* and the phosphorus-containing silica 52*b* including the same material as that of the phosphorus-containing silica 52*a* is provided on the inner walls of the holes 50*b*. Further, the phosphorus-containing silica 52*a* may deposit also on the side walls of the pillar parts 53. The phosphorus-containing silica 52*a* extends in the XY plane along the path 50*a* below the stack body ST. The phosphorus-containing silica 52*b* extends in the Z direction along the holes 50*b* on the outside of the stack body ST. Illustrations of phosphorus-containing silica depositing on the inner walls of the slits 40 are omitted in FIG. 12.

The manner of the etching step of the sacrifice layers 35 in the sixth embodiment is as explained with reference to FIG. 10. However, the pillar parts 53 are provided in the path 50*a* in FIG. 12 and the hot phosphoric acid solution flows around the pillar parts 53 and is discharged through the holes 50*b* or the slits 40. Therefore, the phosphorus-containing silica 52*a* deposits also on the side surfaces of the pillar parts 53.

The path 50*a* in the sixth embodiment can be obtained by forming the sacrifice layer 51 illustrated in FIG. 3A entirely below the stack body ST and in the peripheral part thereof as indicated by 50*a* in FIG. 11. The sacrifice layer 51 is not formed in an area where the pillar parts 53 are to be formed. The holes 50*b* can be formed simultaneously with the slits 40 at the formation step of the slits 40. After the slits 40 and the holes 50*b* are formed, the sacrifice layer 51 for the path 50*a* is removed via the slits 40 and the holes 50*b*. Accordingly, the path 50*a* and the holes 50*b* illustrated in FIGS. 11 and 12 can be formed using an identical manufacturing method to that in the first embodiment.

In the planar view illustrated in FIG. 11, it suffices that the pillar parts 53 are arranged substantially equally in a distributed manner in an area other than the slits 40 and the holes 50*b* and the pillar parts 53 do not always need to be aligned. Even if the pillar parts 53 and the slits 40 or/and the holes 50*b* partially overlap with each other, it suffices that there are openings through which the hot phosphoric acid solution can flow.

First Modification

Figure 13:
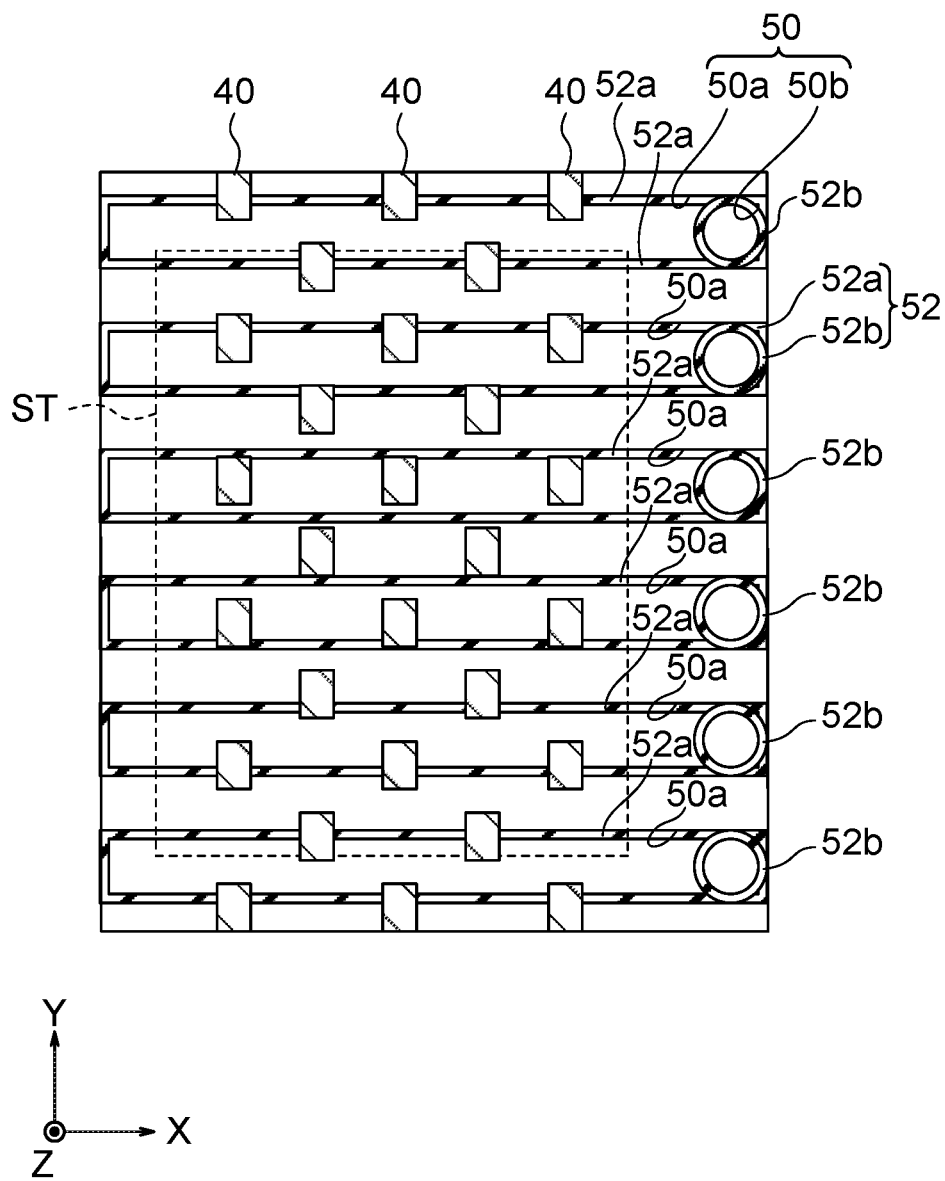
FIG. 13 is a plan view illustrating a configuration example of a semiconductor storage device according to a first modification of the fifth embodiment.

FIG. 13 is a plan view illustrating a configuration example of a semiconductor storage device according to a first modification of the fifth embodiment. The first modification is different from the fifth embodiment in that the slits 40 are arranged in a staggered manner in a planar layout. In other words, the slits 40 are arranged not to be continuous in the X and Y directions but intermittently in the planar layout. Other configurations in the first modification can be identical to those in the fifth embodiment. Therefore, the configurations of the paths 50*a*, the holes 50*b*, the phosphorus-containing silica 52*a*, and the phosphorus-containing silica 52*b* can be identical to those in the fifth embodiment. The fifth embodiment can be applied to these slits 40 arranged in a staggered manner.

Second Modification

Figure 14:
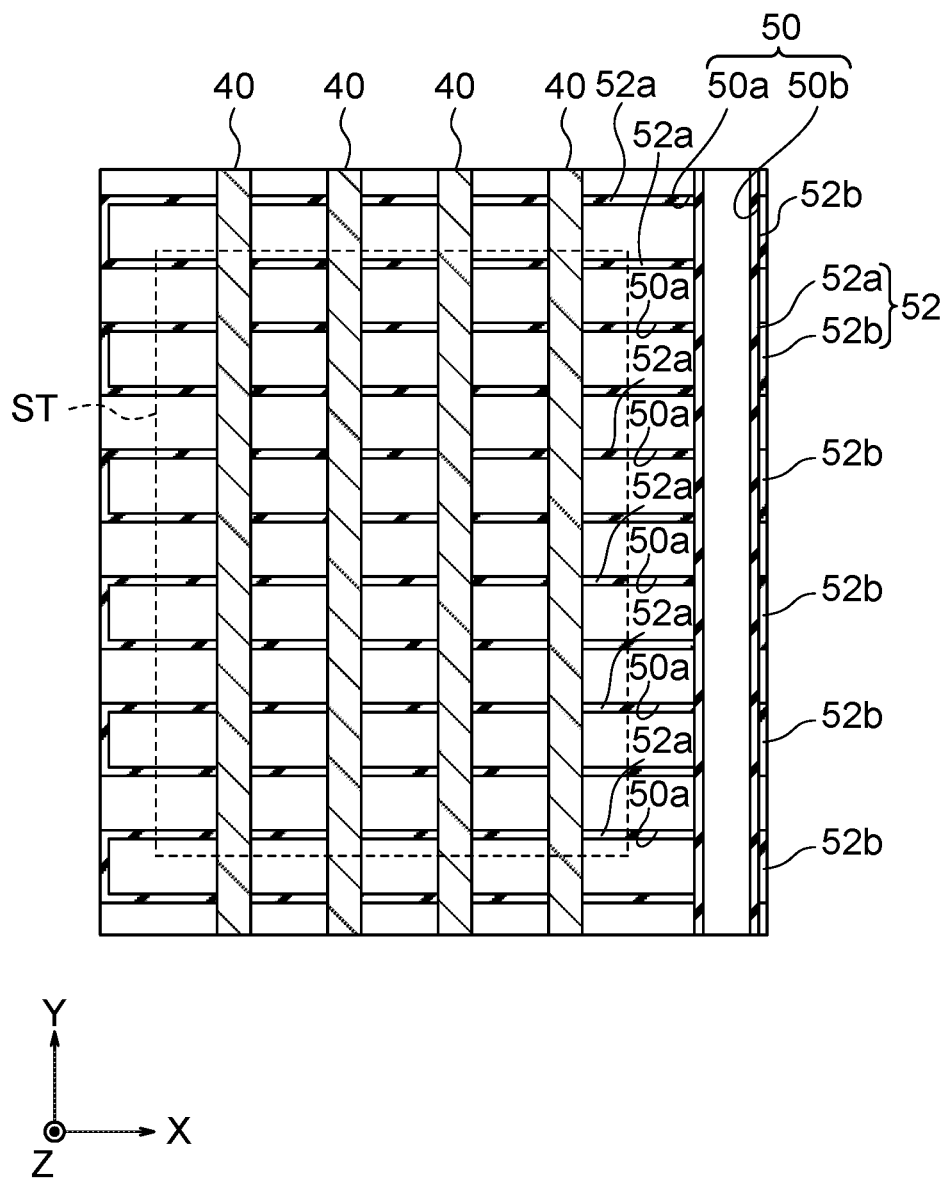
FIG. 14 is a plan view illustrating a configuration example of a semiconductor storage device according to a second modification of the fifth embodiment.

FIG. 14 is a plan view illustrating a configuration example of a semiconductor storage device according to a second modification of the fifth embodiment. The second modification is different from the fifth embodiment in that the holes 50*b* extend continuously in the Y direction in a planar layout similarly to the slits 40. That is, the holes 50*b* are grooves extending in the Y direction. Other configurations in the second modification can be identical to those in the fifth embodiment. With the holes 50b formed to be continuous and in an elongated shape, the discharge efficiency of the phosphorus-containing silica 52 can be further improved.

Third Modification

Figure 15:
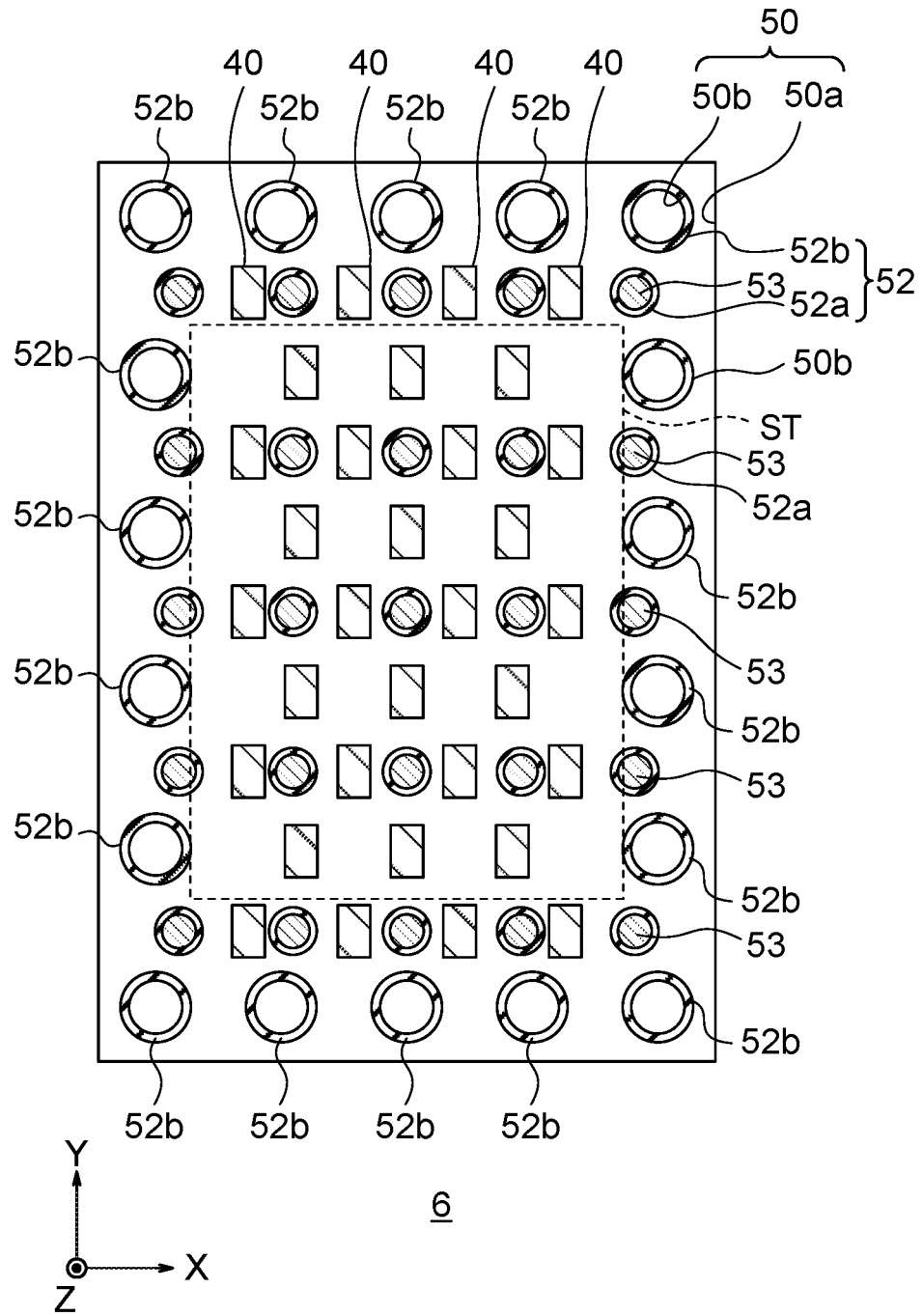
FIG. 15 is a plan view illustrating a configuration example of a semiconductor storage device according to a third modification of the sixth embodiment.

FIG. 15 is a plan view illustrating a configuration example of a semiconductor storage device according to a third modification of the sixth embodiment. The third modification is different from the sixth embodiment in that the slits 40 are arranged in a staggered manner in a planar layout. In other words, the slits 40 are arranged not to be continuous in the X and Y directions but intermittently in the planar layout. Other configurations in the third modification can be identical to those in the sixth embodiment. Therefore, the configurations of the path 50a, the holes 50b, and the phosphorus-containing silica 52a and the phosphorus-containing silica 52b can be identical to those in the sixth embodiment. The sixth embodiment can be applied to the slits 40 that are arranged in a staggered manner.

Fourth Modification

Figure 16:
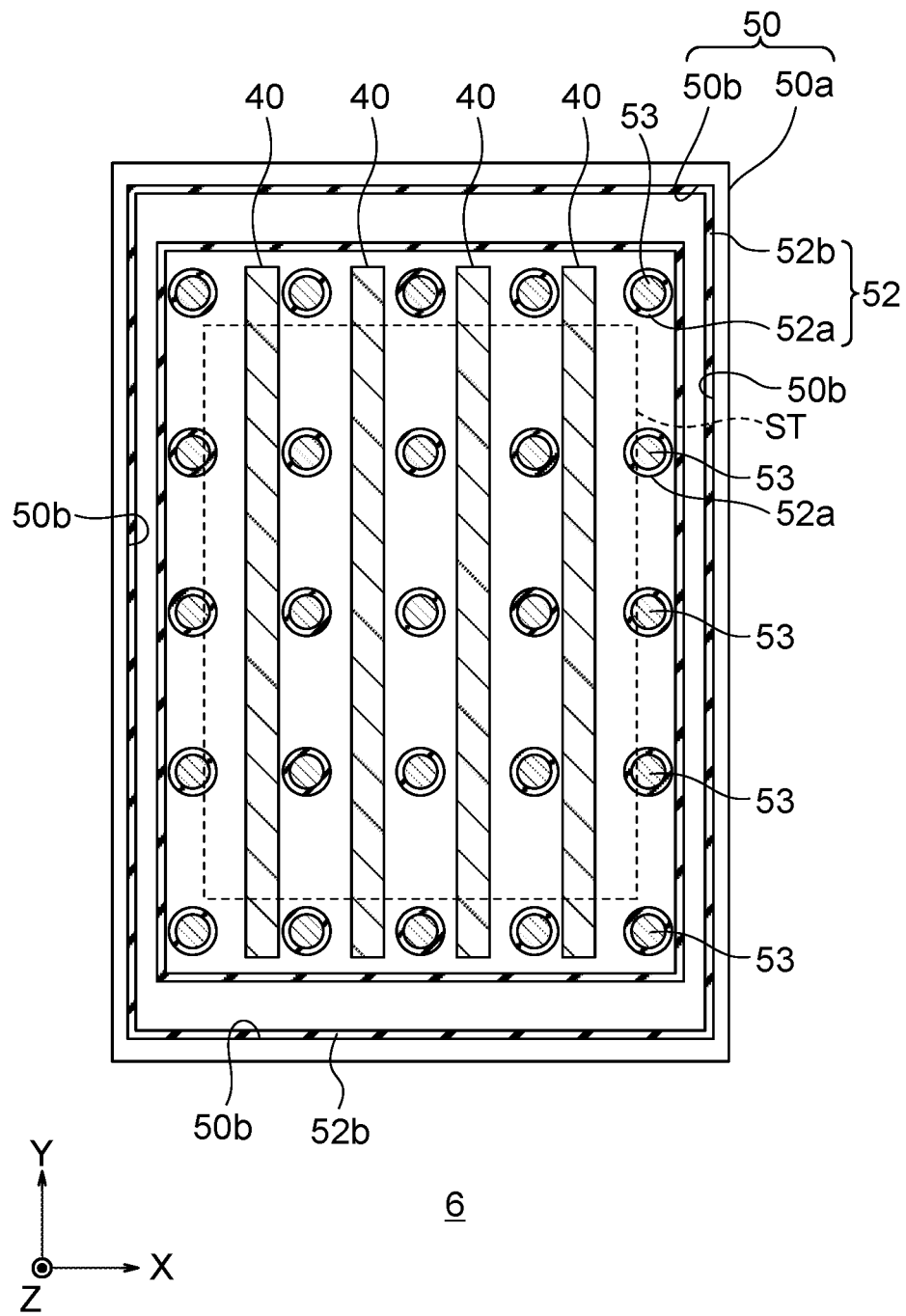
FIG. 16 is a plan view illustrating a configuration example of a semiconductor storage device according to a fourth modification of the sixth embodiment.

FIG. 16 is a plan view illustrating a configuration example of a semiconductor storage device according to a fourth modification of the sixth embodiment. The fourth modification is different from the sixth embodiment in that the holes 50b are provided to continuously encompass the stack body ST in the planar layout. Other configurations in the fourth modification can be identical to those in the sixth embodiment. With provision of the holes 50b continuously around the stack body ST, the discharge efficiency of the phosphorus-containing silica 52 can be further improved.

The slits 50 in the fifth and sixth embodiments and the first to fourth modifications described above are provided in the interlayer dielectric film 30. However, it is permissible to provide the slits 50 in the semiconductor substrate 10 similarly to the third and fourth embodiments.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:
1. A semiconductor storage device comprising:
a substrate;
a stack body provided on the substrate and having first conductive layers and first insulating layers alternately stacked in a first direction;
a pillar part extending in the first direction in the stack body and having a memory film;
an insulating member extending in the first direction at a position different from that of the pillar part in the stack body; and
a phosphorus-containing insulator provided below the stack body and the insulating member, the phosphorus-containing insulator connected to the insulating member,
wherein an end portion of the insulating member is closer to the substrate than an end portion of the pillar part,
wherein the pillar part is separated from the phosphorus-containing insulator in the first direction by at least one of the first insulating layers.
2. The device of claim 1, wherein the phosphorus-containing insulator is provided in a layer manner or a line manner at a certain height in the first direction in the substrate or an interlayer dielectric layer formed between the substrate and the stack body.
3. The device of claim 2, wherein the phosphorus-containing insulator is a silicon oxide containing phosphorus.
4. The device of claim 2, wherein the phosphorus-containing insulator comprises a first insulator area extending in a direction substantially orthogonal to the first direction below the stack body and a second insulator area extending in the first direction and connecting to the first insulator area on an outside of the stack body.
5. The device of claim 2, further comprising a void enclosed by the phosphorus-containing insulator in a layer shape or a box shape.
6. The device of claim 5, wherein the void is enclosed by the phosphorus-containing insulator.
7. The device of claim 1, wherein the phosphorus-containing insulator is a silicon oxide containing phosphorus.
8. The device of claim 7, wherein the phosphorus-containing insulator comprises a first insulator area extending in a direction substantially orthogonal to the first direction below the stack body and a second insulator area extending in the first direction and connecting to the first insulator area on an outside of the stack body.
9. The device of claim 1, wherein the phosphorus-containing insulator comprises a first insulator area extending in a direction substantially orthogonal to the first direction below the stack body and a second insulator area extending in the first direction and connecting to the first insulator area on an outside of the stack body.
10. The device of claim 9, wherein the phosphorus-containing insulator is provided in a pillar manner below the stack body.
11. The device of claim 9, wherein the first insulator area and the second insulator area overlap with each other on an outside of the stack body when viewed from above in the first direction.
12. The device of claim 11, wherein the first insulator area is provided entirely in an area of the stack body when viewed from above in the first direction.
13. The device of claim 11, wherein the second insulator area is arranged substantially evenly around the stack body when viewed from above in the first direction.
14. The device of claim 13, wherein the second insulator area is arranged to surround the stack body when viewed from above in the first direction.
15. The device of claim 1, wherein the phosphorus-containing insulator is provided in a stripe manner or a square manner when viewed from above in the first direction.
16. The device of claim 1, wherein the insulating member extends in the first direction to pass through the stack body.
17. The device of claim 1, wherein the insulating member extends in the first direction and a second direction which is perpendicular to the first direction to divide the stack body.
18. The device of claim 1, wherein the memory film includes:
a charge accumulating film having traps that trap charges,
a tunnel dielectric film serving as a potential barrier, a block dielectric film preventing the charges accumulated in the charge accumulating film.

* * * * *